United States Patent
Otsuki

(10) Patent No.: US 11,041,096 B2
(45) Date of Patent: Jun. 22, 2021

(54) POLISHING AGENT, POLISHING METHOD, AND LIQUID ADDITIVE FOR POLISHING

(71) Applicant: AGC INC., Chiyoda-ku (JP)

(72) Inventor: Toshihiko Otsuki, Tokyo (JP)

(73) Assignee: AGC INC., Chiyoda-ku (JP)

( * ) Notice: Subject to any disclaimer, the term of this patent is extended or adjusted under 35 U.S.C. 154(b) by 0 days.

(21) Appl. No.: 16/179,246

(22) Filed: Nov. 2, 2018

(65) Prior Publication Data
US 2019/0136089 A1   May 9, 2019

(30) Foreign Application Priority Data
Nov. 8, 2017  (JP) .............................. JP2017-215520

(51) Int. Cl.
| | |
|---|---|
| C09G 1/02 | (2006.01) |
| H01L 21/321 | (2006.01) |
| C09G 1/00 | (2006.01) |
| C09G 1/06 | (2006.01) |
| C09K 3/14 | (2006.01) |
| C09G 1/04 | (2006.01) |
| C09K 13/06 | (2006.01) |
| B24B 37/04 | (2012.01) |
| B24B 1/00 | (2006.01) |
| H01L 21/306 | (2006.01) |
| H01L 21/3105 | (2006.01) |
| H01L 21/762 | (2006.01) |

(52) U.S. Cl.
CPC ............... *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/31053* (2013.01); *H01L 21/3212* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 2003/0041526 A1* | 3/2003 | Fujii | ................. C09G 1/02 51/307 |
| 2005/0126080 A1 | 6/2005 | Kon et al. | |
| 2010/0055909 A1 | 3/2010 | Kon et al. | |
| 2018/0086943 A1* | 3/2018 | Hayama | ................. C09G 1/02 |

FOREIGN PATENT DOCUMENTS

WO   WO 2004/010487 A1   1/2004

* cited by examiner

*Primary Examiner* — Jiong-Ping Lu
(74) *Attorney, Agent, or Firm* — Oblon, McClelland, Maier & Neustadt, L.L.P.

(57) ABSTRACT

The present invention relates to a polishing agent including: a water-soluble polymer including a copolymer of a monomer (A) which includes at least one member selected from the group consisting of an unsaturated dicarboxylic acid, a derivative thereof, and salts of the unsaturated dicarboxylic acid and the derivative thereof and a monomer (B) other than the monomer (A), comprising an ethylenic double bond and no acidic group; a cerium oxide particle; and water, in which the polishing agent has a pH of 4 to 9.

13 Claims, 2 Drawing Sheets

POLISHING AGENT, POLISHING METHOD, AND LIQUID ADDITIVE FOR POLISHING

FIELD OF THE INVENTION

The present invention relates to a polishing agent, a polishing method, and a liquid additive for polishing. More specifically, the present invention relates to a polishing agent for chemical mechanical polishing in the manufacture of a semiconductor integrated circuit, a polishing method using the polishing agent, and a liquid additive for polishing for preparing a polishing agent.

BACKGROUND OF THE INVENTION

In recent years, with higher integration and higher functionality of a semiconductor integrated circuit, the development of microfabrication technology for achieving miniaturization and high density of a semiconductor element is advancing. In the manufacture of a semiconductor integrated circuit device (hereinafter, also referred to as a "semiconductor device"), in order to prevent a problem, for example, that unevenness (difference in level) of a layer surface exceeds depth of focus of lithography and in turn, sufficient resolution is not obtained, an interlayer insulating film, an embedded wiring, etc. have been conventionally flattened using Chemical Mechanical Polishing (hereinafter referred to as "CMP"). As the requirement for high definition and miniaturization of an element becomes severe, importance is increasingly placed on high flattening by CMP.

Furthermore, in the recent manufacture of a semiconductor device, an isolation method using shallow trenches having a small element isolation width (Shallow Trench Isolation; hereinafter referred to as "STI") is introduced so as to proceed with higher miniaturization of a semiconductor element.

STI is a technique of forming a trench (groove) on a silicon substrate and embedding an insulating film in the trench, thereby forming an electrically insulated element region. In STI, first, as illustrated in FIG. 1A, an element region of a silicon substrate 1 is masked with a silicon nitride film 2, etc., a trench 3 is formed on the silicon substrate 1, and an insulating layer such as silicon dioxide film 4 is then deposited to fill the trench 3. Subsequently, the silicon dioxide film 4 on the silicon nitride film 2 defining a convex part is polished and removed by CMP while leaving the silicon dioxide film 4 in the trench 3 defining a concave part, and consequently, an element isolation structure in which as illustrated in FIG. 1B, the silicon dioxide film 4 is embedded in the trench 3 is obtained.

In CMP in STI, the progress of polishing can be stopped at the time of exposure of a silicon nitride film by increasing a selection ratio between a silicon dioxide film and a silicon nitride film. A polishing method using the silicon nitride film as a stopper film in this way can provide a smoother surface, compared with the conventional polishing method. In the recent CMP technology, it is important how high the above-described selection ratio is.

A method for improving polishing properties of a polishing agent has been proposed in response to such required characteristics. Patent Document 1 discloses a polishing agent for a base material of a silicon-containing dielectric material, in which the polishing agent contains, as an abrasive grain, a cerium oxide particle, etc. and contains polyacrylic acid or ammonium polyacrylate.

With the polishing agent disclosed in Patent Document 1, the removal rate of silicon dioxide film may be assured of a high value to a certain extent, but since the removal rate of silicon nitride film is not sufficiently controlled, the selection ratio of silicon dioxide film to silicon nitride film is not high enough. In turn, the flatness of the base material obtained is unsatisfactory.

Patent Document 1: WO 2004/010487

SUMMARY OF THE INVENTION

The present invention has been made to solve the problems above, and an object of the present invention is to provide a polishing agent and a polishing method, which are, for example, in CMP, particularly, in CMP in STI of a surface to be polished including a silicon oxide surface, capable of achieving a high selection ratio of silicon dioxide film to silicon nitride film (the selection ratio means a ratio between the removal rate of silicon dioxide film and the removal rate of silicon nitride film; hereinafter, also simply referred to as "selection ratio") and good flatness by keeping the removal rate for a silicon nitride film low while maintaining a sufficiently high removal rate for a silicon oxide film such as silicon dioxide film.

A polishing agent according to the present invention includes:

a water-soluble polymer including a copolymer of a monomer (A) which includes at least one member selected from the group consisting of an unsaturated dicarboxylic acid, a derivative thereof, and salts of the unsaturated dicarboxylic acid and the derivative thereof and a monomer (B) other than the monomer (A), including an ethylenic double bond and no acidic group;

a cerium oxide particle; and water, and the polishing agent has a pH of 4 to 9.

A polishing method according to the present invention includes bringing a polishing pad into contact with a surface to be polished, while supplying a polishing agent to perform polishing by relative movement thereof, and the surface to be polished including a surface including silicon oxide of a semiconductor substrate is polished with the polishing agent according to the present invention as the polishing agent.

A liquid additive for polishing according to the present invention is a liquid additive for preparing a polishing agent by being added to a cerium oxide particle dispersion, the liquid additive includes:

a water-soluble polymer including a copolymer of a monomer (A) which includes at least one member selected from the group consisting of an unsaturated dicarboxylic acid, a derivative thereof, and salts of the unsaturated dicarboxylic acid and the derivative thereof and a monomer (B) other than the monomer (A), including an ethylenic double bond and no acidic group; and water, and the liquid additive has a pH of 4 to 9.

Incidentally, the "surface to be polished" as used in the present invention is a face to be polished of a polishing target and means, for example, a surface. In the present description, the "surface to be polished" encompasses also an intermediate-stage surface appearing on a semiconductor substrate in the process of manufacturing a semiconductor device. The "silicon oxide" as used in the present invention is specifically silicon dioxide, but the present invention is not limited thereto and includes a silicon oxide other than silicon dioxide.

According to the polishing agent and polishing method of the present invention, the removal rate for a silicon nitride film is kept low while maintaining a sufficiently high removal rate for a silicon oxide film, for example, in CMP, particularly, in CMP in STI of a surface to be polished including a silicon oxide surface, so that high selection ratio of silicon oxide to silicon nitride and good flatness can be achieved.

DETAILED DESCRIPTION OF THE INVENTION

Figure 1A:
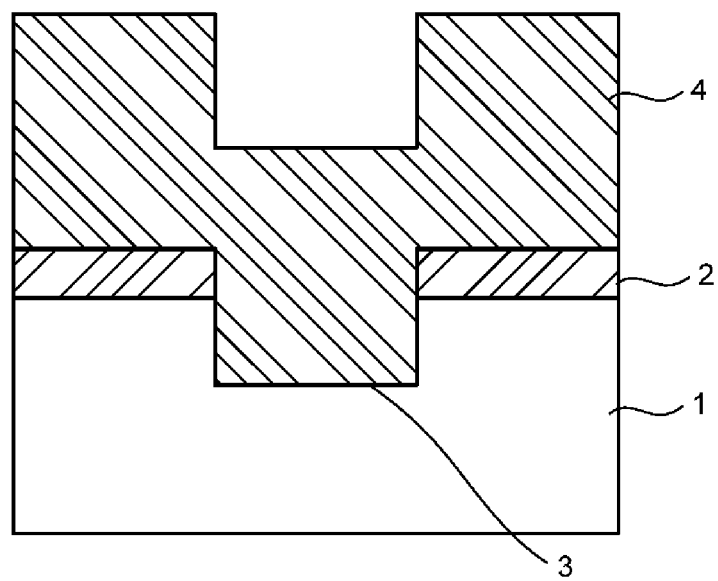
FIGS. 1A and 1B are cross-sectional views of a semiconductor substrate, illustrating the method of polishing by CMP in STI.
Figure 1B:
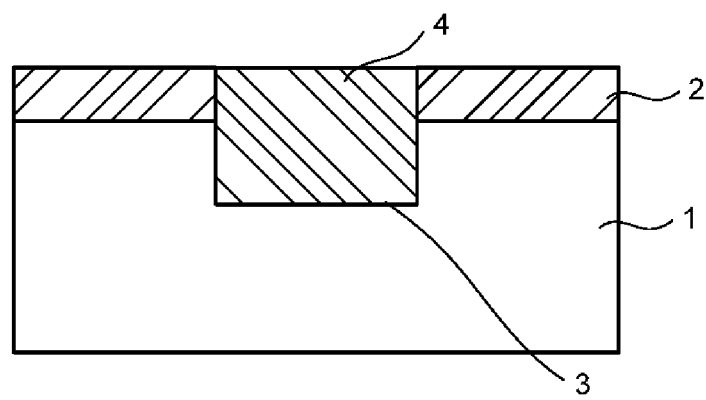

An embodiment of the present invention is described below. However, the present invention is not limited to the following embodiment, and other embodiments can be included in the scope of the present invention as long as they conform to the gist of the present invention.
<Polishing Agent>

The polishing agent of the present invention has a pH of 4 to 9, and includes: a water-soluble polymer including a copolymer of a monomer (A) which includes at least one member selected from the group consisting of unsaturated dicarboxylic acid, a derivative thereof, and salts of the unsaturated dicarboxylic acid and the derivative thereof and a monomer (B) other than the monomer (A), including an ethylenic double bond and no acidic group; a cerium oxide particle; and water.

In the present description, the "water-soluble" means that "10 mg or more of the polymer dissolves in 100 g of water at 25° C.". In the copolymer of monomer (A) and monomer (B), the unit based on monomer (A) and the unit based on monomer (B) are referred to as unit (A) and unit (B), respectively. The water-soluble polymer including a copolymer of monomer (A) and monomer (B) is simply referred to as "water-soluble polymer". In the present description, the numerical range represented using "to" includes the values on both sides thereof as lower and upper limits. In the present description, the "(meth)acrylic acid" is a generic term of "methacrylic acid" and "acrylic acid".

In the case where the polishing agent of the present invention is used, for example, in CMP in STI of a surface to be polished including a silicon oxide film (e.g., silicon dioxide film), by virtue of a high removal rate for a silicon oxide film and a sufficiently low removal rate for a silicon nitride film, a high selection ratio of silicon oxide film to silicon nitride film can be achieved and in turn, polishing providing high flatness can be realized.

In the polishing agent of the present invention, the cerium oxide particle functions as an abrasive grain. In the polishing agent of the present invention, it is considered that the water-soluble polymer including a copolymer of monomer (A) and monomer (B) dissolves in water and functions to assist the action of the abrasive grain as described below at a pH of 4 to 9, whereby the polishing agent of the present invention can exert the above-described remarkable effects.

The mechanism by which the polishing agent of the present invention exerts the excellent polishing properties above is not clearly known, but it is thought that a carboxy group contained in the water-soluble polymer adsorbs to the cerium oxide particle surface and the surface to be polished including a silicon nitride film, whereby the removal rate for the silicon nitride film is reduced. Incidentally, the carboxyl group is believed to function in the same manner as above even in the form of a salt. However, if the carboxy group is derivatized, its function decreases. Accordingly, the monomer (A) preferably contains at least a carboxy group or a salt of carboxy group.

Furthermore, in the copolymer constituting the water-soluble polymer, the unit (A) is hydrophilic, and the unit (B) is hydrophobic. It is considered that since the copolymer has a hydrophobic moiety and a hydrophilic moiety, the removal rate for a silicon nitride film is reduced while maintaining a high removal rate for a silicon oxide film and, as a result, a high selection ratio is obtained.

The polishing agent of the present invention may contain other components besides the water-soluble polymer, cerium oxide particle and water, as long as the effects of the present invention are not impaired. In the following, respective components contained in the polishing agent of the present invention, such as cerium oxide particle, water-soluble polymer, water and other components, and the pH of the liquid are described.
(Cerium Oxide Particle)

The cerium oxide particle contained in the polishing agent of the present invention is not particularly limited. For example, a cerium oxide particle produced by the method described in JP-A-11-12561 or JP-A-2001-35818 can be used. More specifically, a cerium oxide particle obtained by adding an alkali to an aqueous cerium nitrate(IV) ammonium solution to prepare a cerium hydroxide gel and subjecting the gel to filtration, cleaning and firing, or a cerium oxide particle obtained by pulverizing and then firing high-purity cerium carbonate and further pulverizing and classifying the fired product, can be used. In addition, a cerium oxide particle obtained by chemically oxidizing cerium(III) salt in a liquid, as described in JP-T-2010-505735, can also be used.

The average particle diameter of the cerium oxide particles is preferably from 0.01 μm to 0.5 μm, more preferably from 0.03 μm to 0.3 μm. If the average particle diameter of the cerium oxide particles exceeds 0.5 μm, a polishing flaw such as scratch may be generated on the surface to be polished. On the other hand, if the average particle diameter of the cerium oxide particles is less than 0.01 μm, not only the removal rate may decrease but also on account of a large percentage of the surface area per unit volume, the particles are susceptible to the influence of surface state and likely to aggregate depending on the conditions such as pH and additive concentration.

The cerium oxide particle is present as an aggregated particle (secondary particle) resulting from aggregation of primary particles in a liquid and therefore, the preferable particle diameter of the cerium oxide particle is expressed by an average secondary particle diameter. More specifically, the average particle diameter in the numerical range above is usually an average secondary particle diameter. The average secondary particle diameter is measured by a particle size analyzer of laser diffraction/scattering type, etc. by using a dispersion containing particles dispersed in a dispersion medium such as deionized water.

The content ratio (concentration) of the cerium oxide particles is preferably from 0.05 to 2.0 mass % relative to the total mass of the polishing agent. In particular, the content ratio thereof is preferably from 0.15 to 1.0 mass %. When the content ratio of the cerium oxide particles is from 0.05 to 2.0 mass %, a sufficiently high removal rate for a silicon oxide film is obtained. In addition, the viscosity of the polishing agent is not too high, providing good handling properties.

As the cerium oxide particle, particles in the state of being previously dispersed in a medium (hereinafter, referred to as "cerium oxide particle dispersion") may be used. In addition, a dispersant may be incorporated so as to obtain an optimal dispersion effect. The medium is not particularly limited, but water may be preferably used.

(Water)

The polishing agent of the present invention contains water as a medium for dispersing cerium oxide particles and dissolving the later-described water-soluble polymer, etc. The kind of water is not particularly limited, but deionized water, ultrapure water, ion-exchanged water, etc. is preferably used in consideration of the influence on the water-soluble polymer, etc., prevention of contamination by impurities, and the influence on pH, etc.

(Water-Soluble Polymer)

The water-soluble polymer contained in the polishing agent of the present invention is incorporated so as to enhance the removal rate for a silicon oxide film and enhance the selection ratio of silicon dioxide film to silicon nitride film.

The water-soluble polymer includes a copolymer of the following monomer (A) and monomer (B). The monomer (A) includes at least one member selected from the group consisting of an unsaturated dicarboxylic acid, a derivative thereof, and salts of the unsaturated dicarboxylic acid and the derivative thereof. The monomer (B) includes a compound other than the monomer (A), including an ethylenic double bond and no acidic group.

The copolymer includes unit (A) based on the monomer (A) and unit (B) based on the monomer (B), in which each unit may be one kind or two or more kinds and respective units may be connected to one another randomly or block-wise.

As the unsaturated dicarboxylic acid according to the monomer (A), a compound having two carboxy groups per molecule and having an ethylenic double bond may be used without any particular limitation. The unsaturated dicarboxylic acid may be a chain compound or a cyclic compound but is preferably a chain compound. The number of ethylenic double bonds in the unsaturated dicarboxylic acid is not limited but is preferably 1 or 2, more preferably 1. The carbon number excluding the carboxy group of the unsaturated dicarboxylic acid is preferably from 2 to 5, more preferably 2 or 3, particularly preferably 2.

Examples of the unsaturated dicarboxylic acid include maleic acid, fumaric acid, itaconic acid, citraconic acid, mesaconic acid, 2-allylmalonic acid, and isopropylidenesuccinic acid. Among these, at least one member selected from the group consisting of maleic acid, fumaric acid and itaconic acid is preferred, and maleic acid is more preferred in view of polymerizability.

The monomer (A) may be a derivative of an unsaturated dicarboxylic acid, a salt of an unsaturated dicarboxylic acid, or a salt of a derivative of an unsaturated dicarboxylic acid. The salt of a derivative of an unsaturated dicarboxylic acid indicates a compound in which one carboxy group of an unsaturated dicarboxylic acid is derivatized and the other becomes a salt.

Examples of the salt of an unsaturated dicarboxylic acid include an alkali metal salt and an amine salt. Examples of the salt include a sodium salt, a potassium salt, an ammonium salt, a monoethanolammonium salt, a diethanolammonium salt and atriethanolammonium salt, and an ammonium salt is preferred in that contamination by a metal impurity need not be considered.

Examples of the derivative of an unsaturated dicarboxylic acid include an acid anhydride, an ester derivative and an amide derivative, and the derivative is preferably an ester derivative. The ester or amide of an unsaturated dicarboxylic acid may be a derivative in which both or one of carboxy groups of the unsaturated dicarboxylic acid is esterified or amidated.

The ester derivative of an unsaturated dicarboxylic acid is, for example, a compound in which at least one carboxy group (—C(=O)—OH) of the unsaturated dicarboxylic acid becomes —C(=O)—O—$R^1$ (in which $R^1$ is a monovalent substituent). $R^1$ is preferably a saturated hydrocarbon group having a carbon number of 1 to 50, which may have an oxygen atom between carbon-carbon atoms. $R^1$ is more preferably a saturated hydrocarbon group having a carbon number of 2 to 30, still more preferably a carbon number of 5 to 20, which may have an oxygen atom between carbon-carbon atoms. The saturated hydrocarbon group may be linear, branched or cyclic or may be a linear or branched chain containing a cyclic structure.

The amide derivative of an unsaturated dicarboxylic acid is, for example, a compound in which at least one carboxy group (—C(=O)—OH) of the unsaturated dicarboxylic acid becomes —C(=O)—$NR^2R^3$ (in which each of $R^2$ and $R^3$ is independently a hydrogen atom or a monovalent substituent). In the case where $R^2$ and $R^3$ are a monovalent substituent, examples of the substituent include the same groups as those for $R^1$ described above. The preferred embodiment thereof is also the same as that of $R^1$.

The monomer (A) includes at least one member selected from the group consisting of an unsaturated dicarboxylic acid, a derivative thereof, and salts of the unsaturated dicarboxylic acid and the derivative thereof. In the case where the monomer (A) includes two or more of these members, they may be a combination of different kinds of unsaturated dicarboxylic acids or a combination of an unsaturated dicarboxylic acid and a derivative thereof and/or their salts, with the unsaturated dicarboxylic acid being the same.

The monomer (A) preferably contains a salt of an unsaturated dicarboxylic acid. That is, in the copolymer, unit (A) based on the monomer (A) preferably has a salt of a carboxy group. When the monomer (A) contains a salt of an unsaturated dicarboxylic acid, the water solubility of the copolymer is increased.

The monomer (A) preferably contains at least one member selected from the group consisting of an ester derivative in which at least a part of an unsaturated dicarboxylic acid is esterified, and a salt thereof. Incidentally, the salt here is a salt of an ester derivative in which at least a part of an unsaturated dicarboxylic acid is esterified. When the monomer (A) contains an ester derivative of an unsaturated dicarboxylic acid, the polishing agent of the present invention can have a higher selection ratio, and therefore, it is particularly preferred that the monomer (A) is a salt of an ester derivative in which a part of an unsaturated dicarboxylic acid is esterified.

In the preferred embodiment above, examples of the monomer (A) include an embodiment containing an ester derivative in which one or both of carboxy groups of an unsaturated dicarboxylic acid are esterified, an embodiment containing a compound in which one of the unsaturated dicarboxylic acid is esterified and the other becomes a salt, and an embodiment containing a mixture thereof. Furthermore, in the case where the monomer (A) described above is a salt, the monomer (A) may be an embodiment containing a combination of an ester derivative in which at least a part of an unsaturated dicarboxylic acid is esterified, and a salt of an unsaturated dicarboxylic acid.

The expression "the monomer (A) contains a salt of an unsaturated dicarboxylic acid" as used in the present invention means that in the copolymer of monomer (A) and monomer (B), the unit (A) contains a salt of a carboxy group. More specifically, the expression "the monomer (A) contains a salt of an unsaturated dicarboxylic acid" encompasses both a case where the monomer (A) is a salt at the time of production of the copolymer, and a case where after obtaining the copolymer, a carboxy group of unit (A) is turned into a salt.

Describing the monomer (A) by reference, for example, to maleic acid that is suitable as the unsaturated dicarboxylic acid, the monomer (A) preferably contains at least one member selected from the group consisting of a maleic acid monoester, a maleic acid diester, and a salt of a maleic acid monoester. In this case, the monomer (A) may contain a maleic acid or may contain a maleic acid salt. It is more preferable for the monomer (A) to contain a salt of a maleic acid monoester or contain a maleic acid ester and a maleic acid salt in combination, and it is particularly preferable to contain a salt of a maleic acid monoester.

In the monomer (A) as whole, that is, in unit (A) in the copolymer, the ratio between an esterified carboxy group and a salt of carboxy group is preferably from 1:9 to 9:1, particularly preferably 5:5. Incidentally, when a carboxy group forms a salt in the monomer (A), a carboxy group (—COOH) is not present in the monomer (A) due to manufacturing reason.

The monomer (B) is a compound other than the monomer (A), including an ethylenic double bond and no acidic group. The monomer (B) may be a chain compound or a cyclic compound containing a ring structure and is preferably a cyclic compound containing a ring structure. When the monomer (B) contains a ring structure, the storage stability of the obtained polishing agent is increased.

In the case where the monomer (B) contains a ring structure, unit (B) in the copolymer preferably has a ring structure in the side chain. In this case, the ring is an aliphatic ring or an aromatic ring and is preferably a 5-membered ring or a 6-membered ring. The number of ethylenic double bonds is not particularly limited but includes a range of 1 to 5 and is preferably 1 or 2, particularly preferably 1. Furthermore, in the case where the monomer (B) contains a ring structure, the ring may be a heterocycle containing, in the skeleton, an element other than carbon atom, for example, an oxygen atom or a nitrogen atom, and the hydrogen atom bonded to the ring may be substituted by a substituent except for an acidic group. Examples of the substituent include a hydrocarbon group having a carbon number of 1 to 30, an oxy group (—O—R), an oxo group (=O), a carbonyl group (—CO—R), an amino group (—NH—R), an imino group (=N—R), an azo group (—N=N—R), a diazo group (—N≡N—R), a halogen group, a thio group (—S—R), and a phosphono group. Here, R is a monovalent organic group.

In the case where the monomer (B) is a chain compound, the number of ethylenic double bonds is not particularly limited but includes a range of 1 to 5 and is preferably 1 or 2, particularly preferably 1. The chain compound is a linear or branched chain, and the carbon number thereof is not particularly limited but includes a range of 2 to 30 and is preferably from 2 to 10.

Examples of the monomer (B) containing a ring structure include a monocyclic olefin such as cyclobutane, cyclopentene, cyclohexene, cycloheptene and cyclooctene, or a derivative thereof; a cyclic conjugated diene such as cyclopentadiene, cyclohexadiene, cycloheptadiene and cyclooctadiene, or a derivative thereof; a polycyclic olefin such as norbornene, dicyclopentadiene, tricyclodecene, tetraclododecene and hexacycloheptadecene, or a derivative thereof; a vinyl-alicyclic hydrocarbon such as vinylcyclobutane, vinylcyclobutene, vinylcyclopentane, vinylcyclopentene, vinylcyclohexane, vinyl cyclohexene, vinyl cycloheptane, vinylcycloheptene, vinylcyclooctane, vinylcyclooctene, N-vinylpyrrolidone, N-vinylcarbazole and 4-vinylpyridine, or a derivative thereof; and a vinyl-aromatic monomer such as styrene, methyl styrene, vinyltoluene, p-tert-butyl styrene, chloromethylstyrene, o-(or p-, m-)hydroxystyrene, and o-(or p-, m-)hydroxyphenyl acrylate, or a derivative thereof.

Examples of the monomer (B) that is a chain compound include an olefin such as ethylene, propylene, butene, pentene, hexene, heptene, octene, nonene, decene, isopropylene, isobutene, isopentene, isohexene, isoheptene, isooctene, isononene and isodecene, or a derivative thereof, an aliphatic conjugated diene such as butadiene, 1,3-butadiene, isoprene, 2,3-dimethyl-1,3-butadiene and 1,3-pentadiene, or a derivative thereof, a (meth)acrylic acid ester such as methyl (meth)acrylate, ethyl (meth)acrylate, propyl (meth)acrylate, n-amyl (meth)acrylate, isoamyl (meth)acrylate, n-hexyl (meth)acrylate, 2-ethylhexyl (meth)acrylate, n-octyl (meth)acrylate, 2-hydroxyethyl (meth)acrylate and hydroxypropyl (meth)acrylate, or a derivative thereof, an ethylenically unsaturated carboxylic acid hydroxyalkyl ester such as β-hydroxyethyl acrylate, β-hyddroxypropyl acrylate and β-hydroxyethyl methacrylate, or a derivative thereof; an unsaturated carboxylic acid glycidyl ester such as glycidyl acrylate and glycidyl methacrylate, or a derivative thereof, a vinyl compound such as acrolein and allyl alcohol, or a derivative thereof, an ethylenically unsaturated nitrile such as acrylonitrile and methacrylonitrile, or a derivative thereof; and an ethylenically unsaturated carboxylic acid amide such as acrylamide, methacrylamide, N-methylolacrylamide and diacetone acrylamide, or a derivative thereof.

Among these, as the monomer (B), styrene, N-vinylpyrrolidone, 4-vinylpyridine, heptene, octene, nonene, and isobutene are preferred, styrene, N-vinylpyrrolidone and 4-vinylpyridine are more preferred, and styrene is particularly preferred.

Incidentally, the monomer (B) may be one kind or two or more kinds. For example, in the case where the monomer (B) contains styrene, the monomer (B) may contain a monomer other than styrene, such as N-vinylpyrrolidone, heptene, octene, nonene and isobutene. In this case, the content ratio of styrene is preferably from 50 to 100 mol %, more preferably from 70 to 100 mol %, particularly preferably 100 mol %, relative to the whole of the monomer (B).

Each of the monomer (A) and monomer (B) in the copolymer has been described. The monomer (A) and the monomer (B) can be combined by appropriately selecting one kind or two or more kinds for each monomer. The preferable combination is a combination of preferable monomers recited above for the monomer (A) and the monomer (B), respectively. In the copolymer used for the polishing agent of the present invention, a combination where the unsaturated dicarboxylic acid in the monomer (A) contains maleic acid and the monomer (B) contains styrene is particularly preferred.

In the copolymer, the ratio of the monomer (A) to the monomer (B), that is, the ratio of unit (A) to unit (B), is not particularly limited. Considering the balance between hydrophilicity of unit (A) and hydrophobicity of unit (B), the molar ratio of unit (A) to unit (B) includes a range from 10:90 to 90:10, and the molar ratio thereof is preferably from 20:80 to 80:20, more preferably from 40:60 to 60:40.

The weight average molecular weight of the copolymer is preferably from 500 to 1,000,000, more preferably from 1,000 to 20,000, still more preferably from 2,000 to 10,000. When the weight average molecular weight of the copolymer is 500 or more, the copolymer can be stably kept in a state of being adsorbed to a cerium oxide particle surface and a surface to be polished including a silicon oxide film. When the average molecular weight of the copolymer is 1,000,000 or less, the handling properties, etc. are good. Unless otherwise indicated, the weight average molecular weight (hereinafter, also denoted by "Mw") as used in the present description is a weight average molecular weight measured by gel permeation chromatograph (GPC).

The water-soluble polymer includes a copolymer of monomer (A) and monomer (B), in which the copolymer is one kind or two or more kinds. As for the acid value and weight average molecular weight of the water-soluble polymer, the same ranges as those of the acid value and weight average molecular weight of the copolymer above are preferred.

The content ratio (concentration) of the water-soluble polymer is preferably from 0.001 to 10.0 mass %, more preferably from 0.01 to 5.0 mass %, relative to the total mass of the polishing agent, because a high removal rate for a silicon oxide film as well as a high selection ratio are obtained. In addition, the content ratio thereof is still more preferably from 0.05 to 2.0 mass %, because a sufficiently high removal rate for a silicon oxide film as well as a higher selection ratio are obtained.

(pH)

The pH of the polishing agent of the present invention is from 4 to 9. When the pH of the polishing agent is 9 or less, the effect of reducing the removal rate for a silicon nitride film and enhancing the selection ratio is sufficiently obtained. In addition, when the pH of the polishing agent is 4 or more, the removal rate for a silicon oxide film is enhanced. The pH of the polishing agent is more preferably from 5 to 9, particularly preferably from 6 to 8.

The polishing agent of the present invention may contain a pH regulator so as to adjust the pH to a predetermined value. The pH regulator is preferably an acid, and various inorganic acids or organic acids or salts thereof may be used. The inorganic acid is not particularly limited, but examples thereof include nitric acid, sulfuric acid, hydrochloric acid, and phosphoric acid. The organic acid is not particularly limited, but examples thereof include carboxylic acid, sulfonic acid, and phosphoric acid. Among these, carboxylic acid is preferred. The carboxylic acid may be any appropriate carboxylic acid, but more preferable carboxylic acids are exemplified below.

Carboxylic acid (monocarboxylic acid, polycarboxylic acid) having a nitrogen-containing heterocyclic group: 2-pyridinecarboxylic acid, 3-pyridinecarboxylic acid, 4-pyridinecarboxylic acid, 2,3-pyridinedicarboxylic acid, 2,4-pyridinedicarboxylic acid, 2,5-pyridinedicarboxylic acid, 2,6-pyridinedicarboxylic acid, 3,4-pyridinedicarboxylic acid, 3,5-pyridinedicarboxylic acid, pyrazinecarboxylic acid, 2,3-pyrazinedicarboxylic acid, 2-quinolinecarboxylic acid, pyroglutamic acid, picoline acid, and DL-pipecolic acid.

Carboxylic acid having a cyclic compound except for nitrogen: 2-furancarboxylic acid, 3-furancarboxylic acid, tetrahydrofuran-2-carboxylic acid, and tetrahydrofuran-2,3,4,5-tetracarboxylic acid.

Amino group-containing carboxylic acid (e.g., amino acid): alanine, glycine, glycylglycine, aminobutyric acid, N-acetylglycine, N,N-di(2-hydroxyethyl)glycine, N-(tert-butoxycarbonyl)glycine, proline, trans-4-hydroxy-L-proline, phenylalanine, sarcosine, hydantoic acid, creatine, N-[tris(hydroxymethyl)methyl]glycine, glutamic acid, and aspartic acid.

Hydroxyl group-containing carboxylic acid (e.g., hydroxycarboxylic acid): lactic acid, malic acid, citric acid, tartaric acid, glycolic acid, gluconic acid, salicylic acid, 2-hydroxyisobutyric acid, glyceric acid, 2,2-bis(hydroxymethyl)propionic acid, and 2,2-bis(hydroxymethyl)butyric acid.

Ketone group-containing carboxylic acid (keto acid): pyruvic acid, acetoacetic acid, and levulinic acid.

Cyclic carboxylic acid: cyclopentanecarboxylic acid, cyclohexanecarboxylic acid, cycloheptanecarboxylic acid, and cyclohexylcarboxylic acid.

Polycarboxylic acids other than those described above: oxalic acid, malonic acid, succinic acid, fumaric acid, maleic acid, glutaric acid, adipic acid, and phthalic acid.

The above-described inorganic acid or organic acid may also be used as a salt. As for the salt, an alkali metal salt, an amine salt, etc. may be used. Specifically, examples of the salt include a sodium salt, a potassium salt, an ammonium salt, a monoethanolammonium salt, a diethanolammonium salt, and a triethanolammonium salt.

In addition, as a pH regulator, various basic compounds may be added to the polishing agent of the present invention. The basic compound is preferably water-soluble but is not particularly limited thereto. The basic compound that can be used includes, for example, ammonia, potassium hydroxide, a quaternary ammonium hydroxide such as tetramethylammonium hydroxide (hereinafter, referred to as TMAH) and tetraethylammonium hydroxide, and an organic amine such as monoethanolamine (hereinafter, referred to as MEA) and ethylene diamine.

In the polishing agent of the present invention, an aggregation inhibitor or a dispersant may be incorporated, other than the components described above.

The dispersant is incorporated so as to stably disperse cerium oxide particles in a dispersion medium such as deionized water. Examples of the dispersant include anionic, cationic, nonionic and amphoteric surfactants, and anionic, cationic, nonionic and amphoteric polymer compounds, and one of these or two or more thereof may be incorporated.

Furthermore, in the polishing agent of the present invention, a lubricant, a tackifier or viscosity regulator, a preservative, etc. may be appropriately incorporated, if desired.

For the convenience of storage or transportation of the polishing agent of the present invention, a cerium oxide particle dispersion (hereinafter, referred to as "dispersion") and an aqueous solution obtained by dissolving the water-soluble polymer in water (liquid additive for polishing) may be separately prepared as two liquids and be mixed at the time of use.

<Liquid Additive for Polishing>

The liquid additive for polishing of the present invention is a liquid additive for preparing a polishing agent by being added to a cerium oxide particle dispersion, in which the liquid additive has a pH of 4 to 9, and includes: a water-soluble polymer including a copolymer of a monomer (A) which includes at least one member selected from the group consisting of an unsaturated dicarboxylic acid, a derivative thereof, and salts of the unsaturated dicarboxylic acid and the derivative thereof and a monomer (B) other than the monomer (A), including an ethylenic double bond and no acidic group; and water. When a method of using this liquid additive for polishing in the preparation of the polishing agent and adding it to a cerium oxide particle dispersion is employed, the convenience of storage or transportation of the polishing agent can be enhanced.

Respective components contained in the liquid additive for polishing of the present invention, i.e., a water-soluble polymer and water, and the pH of the liquid are the same as those described for respective components contained in the polishing agent above and the pH of the liquid.

In the liquid additive for polishing of the present invention, the content ratio (concentration) of the water-soluble polymer is preferably from 0.001 to 30 mass %, more preferably from 0.01 to 20 mass %, still more preferably from 0.1 to 10 mass %, relative to the entire liquid additive.

In the cerium oxide particle dispersion to which the liquid additive is added, the content ratio of the cerium oxide particle in the liquid is preferably from 0.2 to 40 mass %, more preferably from 1 to 20 mass %, still more preferably from 5 to 10 mass %.

The liquid additive for polishing of the present invention is added to the cerium oxide particle dispersion, so that a polishing agent capable of achieving high selection ratio and flatness by keeping the removal rate for a silicon nitride film low while maintaining a high removal rate for a silicon oxide film can be obtained.

Incidentally, in the case of preparing the polishing agent by mixing two separate liquids, i.e., the cerium oxide particle dispersion and the liquid additive for polishing of the present invention, the concentration of the cerium oxide particle in the dispersion and the concentration of the water-soluble polymer in the liquid additive for polishing may be enriched to be from 2 to 100 times higher than the concentrations in using the polishing agent and be diluted to predetermined concentrations at the time of use. More specifically, for example, in the case where both the concentration of the cerium oxide particle in the dispersion and the concentration of the water-soluble polymer in the liquid additive are enriched 10 times, 10 parts by mass of the dispersion, 10 parts by mass of the liquid additive for polishing, and 80 parts by mass of water are mixed and stirred, and the resulting mixture is used as the polishing agent.

<Preparation Method of Polishing Agent>

In order to prepare the polishing agent of the present invention, a method of adding the water-soluble polymer to a dispersion in which cerium oxide particles are dispersed in water such as deionized water or ion-exchanged water, followed by mixing, is used. After the mixing, the mixture is stirred for a predetermined time with a stirrer, etc., and a uniform polishing agent is thereby obtained. In addition, after the mixing, the mixture may be treated in an ultrasonic disperser to obtain a better dispersion state.

The polishing agent of the present invention need not necessarily be supplied to the polishing site after previously mixing all of the constituent polishing components. The polishing components may be mixed to formulate the composition of the polishing agent when it is supplied to the polishing site.

For the convenience of storage or transportation of the polishing agent of the present invention, as described above, a cerium oxide particle dispersion and an liquid additive for polishing may be separately prepared as two liquids and be mixed at the time of use. The method for preparing the polishing agent by mixing two separate liquids, i.e., the dispersion and the liquid additive for polishing, is described hereinabove.

<Polishing Method>

The polishing method according to an embodiment of the present invention is a method of bringing a surface to be polished of a polishing target into contact with a polishing pad while supplying the above-described polishing agent, and performing polishing by relative movement between those two members. Here, the surface to be polished which is to be subjected to polishing is, for example, a surface including a face including silicon dioxide of a semiconductor substrate. Preferable examples of the semiconductor substrate include a substrate for the above-described STI. The polishing agent of the present invention is effective also in polishing for flattening of an interlayer insulating film between multilayer interconnections in the manufacture of a semi conductor device.

The silicon dioxide film in a substrate for STI includes a so-called PE-TEOS film deposited by a plasma CVD method using tetraethoxysilane (TEOS) as a raw material. In addition, as the silicon dioxide film, a so-called HDP film deposited by a high-density plasma CVD method may be mentioned. Furthermore, a HARP film or FCVD film deposited by other CVD methods, and an SOD film formed by spin coating may also be used. As the silicon nitride film, a film deposited by a low-pressure CVD method or plasma CVD method using silane or dichlorosilane and ammonia as raw materials, and a film deposited by an ALD method may be mentioned.

Figure 2:
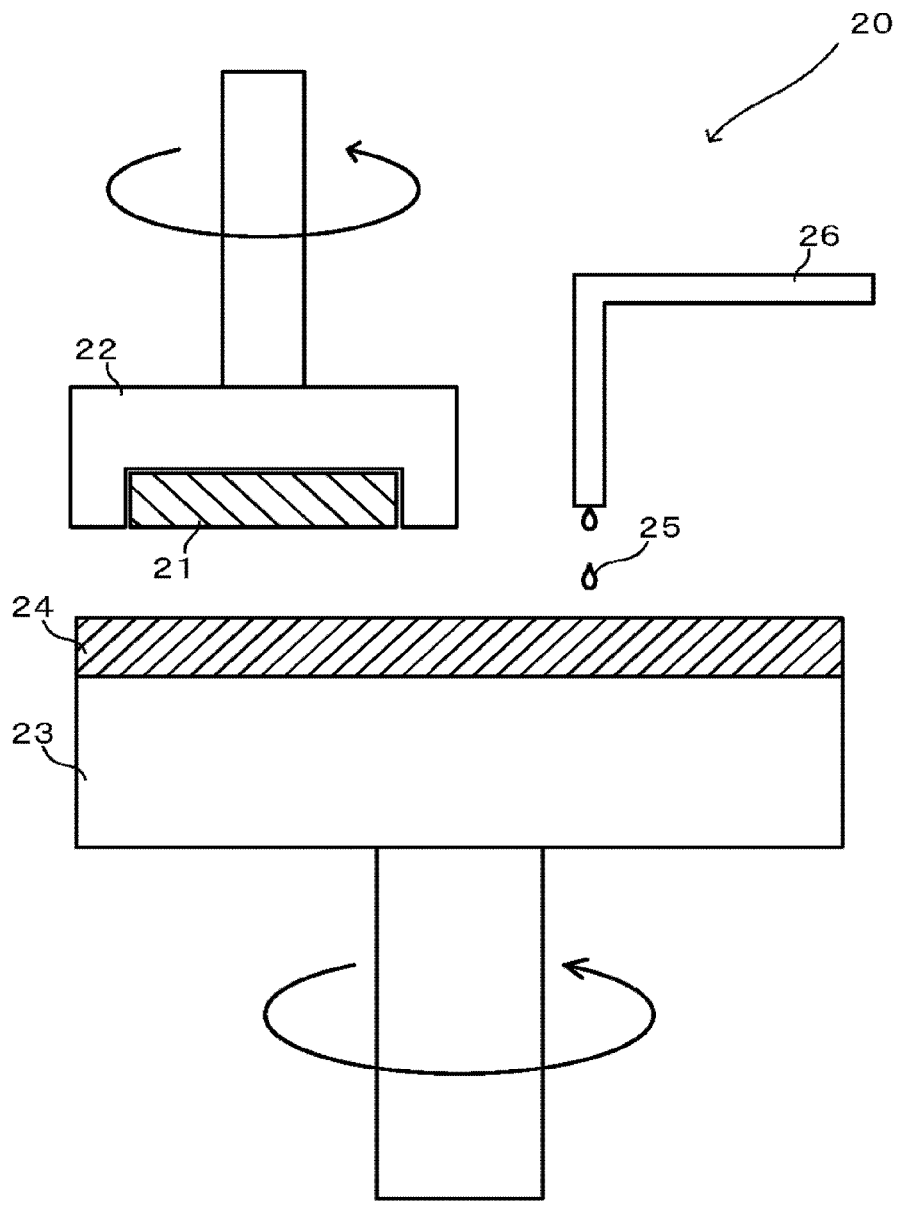
FIG. 2 is a view illustrating one example of the polishing apparatus that can be used in the polishing method of the present invention.

In the polishing method according to an embodiment of the present invention, a known polishing apparatus can be used. FIG. 2 is a view illustrating one example of the polishing apparatus that can be used in the polishing method of the present invention.

The polishing apparatus 20 has a polishing head 22 for holding a semiconductor substrate 21 such as STI substrate, a polishing platen 23, a polishing pad 24 attached to a surface of the polishing platen 23, and a polishing agent supply pipe 26 for supplying a polishing agent 25 to the polishing pad 24. The apparatus is configured to bring the surface to be polished of the semiconductor substrate 21 held in the polishing head 22 into contact with the polishing pad 24 while supplying the polishing agent 25 from the polishing agent supply pipe 26 and perform polishing by relative rotational movement between the polishing head 22 and the polishing platen 23. Incidentally, the polishing apparatus used in the embodiment of the present invention is not limited to such a structure.

The polishing head 22 may perform not only rotational movement but also linear movement. In addition, the polishing platen 23 and the polishing pad 24 may have a size equivalent to or smaller than that of the semiconductor substrate 21. In this case, the polishing head 22 and the polishing platen 23 are preferably moved relatively so that the entire surface of the surface to be polished of the semiconductor substrate 21 can be polished. Furthermore, the polishing platen 23 and the polishing pad 24 may not perform rotational movement and may move, for example, in one direction by a belt system.

The polishing conditions of the polishing apparatus 20 are not particularly limited, but when the polishing head 22 is pressed against the polishing pad 24 by applying a load, the polishing pressure can be more increased, and the removal rate can be enhanced. The polishing pressure is preferably on the order of 0.5 to 50 kPa, and in view of uniformity of the removal rate within the surface to be polished of the semiconductor substrate 21, flatness and prevention of a polishing defect such as scratch, the polishing pressure is more preferably on the order of 3 to 40 kPa. The rotation speed of the polishing platen 23 and the polishing head 22 is preferably on the order of 50 to 500 rpm, but the present invention is not limited thereto. The supply amount of the polishing agent 25 is appropriately adjusted according to the composition of polishing agent, the above-described polishing conditions, etc.

As the polishing pad 24, a pad made of nonwoven fabric, foamed polyurethane, porous resin, nonporous resin, etc. may be used. In order to accelerate the supply of the polishing agent 25 to the polishing pad 24 or allow a certain amount of the polishing agent 25 to stay on the polishing pad 24, the surface of the polishing pad 24 may be processed to form a groove, for example, in a lattice-like, concentric or spiral manner. In addition, a pad conditioner may be brought into contact with the surface of the polishing pad 24, if desired, to perform polishing while conditioning the surface of the polishing pad 24.

According to the polishing method of the present invention, in a CMP treatment at the time of manufacture of a semiconductor device, such as flattening of an interlayer insulating film or flattening of an insulating film for STI, a surface to be polished including silicon oxide (e.g., silicon dioxide) can be polished at a high removal rate and moreover, a high selection ratio of a silicon oxide film to a silicon nitride film can be realized, so that high flatness can be achieved.

EXAMPLES

The present invention is specifically described below by reference to working examples and comparative examples, but the invention should not be construed as being limited to those examples. In following Examples, unless otherwise indicated, "%" means mass %. The characteristic values were measured and evaluated by the following methods. Examples 1 to 14 are working examples, and Examples 15 to 18 are comparative examples.

[pH]

The pH was measured using a pH meter, HM-30R, manufactured by DKK-TOA Corporation.

[Average Secondary Particle Diameter]

The average secondary particle diameter was measured using a laser scattering/diffraction particle size distribution analyzer (manufactured by Horiba, Ltd., device name: LA-920).

[Polishing Properties]

The polishing properties were evaluated using a full automatic CMP polishing apparatus, FREX300 (manufactured by EBARA CORPORATION). As the polishing pad, a two-layer pad (IC-1570, manufactured by Rodel, Inc.) was used, and for the conditioning of polishing pad, a diamond pad conditioner (trade name: A165, manufactured by 3M Company) was used. The polishing conditions were a polishing pressure of 21 kPa, a rotation speed of the polishing platen of 100 rpm, and a rotation speed of the polishing head of 102 rpm. Unless otherwise indicated, the supply rate of the polishing agent was set to 250 ml/min.

As a polishing target (an object to be polished) for the evaluation of removal rate and selection ratio, a silicon dioxide film-attached wafer in which a silicon dioxide film was deposited on a 12-inch silicon wafer by plasma CVD using tetraethoxysilane or monosilane as a raw material, was used, and in addition, a silicon nitride film-attached wafer in which a silicon nitride film was deposited in the same manner as above by CVD, was used (hereinafter, these wafers are referred to as "blanket wafer").

Incidentally, for the measurement of the film thickness of each of the silicon dioxide film and silicon nitride film deposited on the blanket substrate, a thickness meter, VM-3210, manufactured by SCREEN Semiconductor Solutions Co., Ltd. was used. The removal rate for each of the silicon dioxide film and the silicon nitride film was calculated by determining the difference between the film thickness before polishing of the blanket substrate and the film thickness after polishing for 1 minute. The average value (nm/min) of the removal rate, obtained from the removal rates at 49 in-plane points of the substrate, was used as an indicator for evaluation of the removal rate. Furthermore, the ratio between the removal rate for a silicon dioxide film and the removal rate for a silicon nitride film (removal rate for silicon dioxide film/removal rate for silicon nitride film) was calculated as a selection ratio.

The results shown together in Table 1 demonstrate, based on Examples 1 to 14 as working examples and Examples 15 to 18 as comparative examples, that when a blanket wafer is polished with the polishing agent of the present invention, a high removal rate for silicon dioxide is obtained and the polishing agent has a very high selection ratio of silicon dioxide to silicon nitride.

(Water-Soluble Polymer and Water-Soluble Polymer of Comparative Example)

The molecular configurations of the water-soluble polymer including a copolymer of monomer (A) and monomer (B) (water-soluble polymer for working example) and the water-soluble polymer for comparative example, which are used in each of the following Examples, are described below.

(Water-Soluble Polymer for Example)

Water-Soluble Polymer A:

A 50:50 (molar ratio) copolymer of a maleic acid alkyl (the alkyl is a linear alkyl having a carbon number of 19 to 20) ester ammonium salt as the monomer (A) and styrene as the monomer (B); Mw: 3,000.

Water-Soluble Polymer B:

A 50:50 (molar ratio) copolymer of a maleic acid 2-butoxyethyl ester ammonium salt as the monomer (A) and styrene as the monomer (B); Mw: 7,000.

Water-Soluble Polymer C:

A copolymer of an ammonium maleate salt as the monomer (A) and octene ($C_8H_{16}$) as the monomer (B).

Water-Soluble Polymer D:

A copolymer of an ammonium maleate salt as the monomer (A) and isobutylene as the monomer (B); Mw: from 55,000 to 65,000.

Water-Soluble Polymer E:

A copolymer of an ammonium maleate salt as the monomer (A) and styrene as the monomer (B); Mw: 600,000.

Water-Soluble Polymer F:

A 33:66 (molar ratio) copolymer of a maleic acid 1-propyl ester (assumed adduct) ammonium salt as the monomer (A) and styrene as the monomer (B); Mw: 9,000.

In all of the monomer (A) above, the ratio between ester and ammonium salt in the maleic acid ester ammonium salt is 1:1.

(Water-Soluble Polymer for Comparative Example)

Water-Soluble Polymer G:

A homopolymer of an ammonium acrylate salt; Mw: 5,000.

Water-Soluble Polymer H:
A homopolymer of maleic acid.

Example 1

Two kinds of cerium oxide particles differing in the average particle diameter and ammonium polyacrylate having a molecular weight of 5,000 as a dispersant were added to deionized water to provide a mass ratio of 100:0.7, mixed under stirring, and subjected to ultrasonic dispersion and filtering to prepare a cerium oxide particle dispersion having a cerium oxide particle concentration of 10% and a dispersant concentration of 0.07%. Incidentally, the average secondary particle diameter of cerium oxide particles was 0.11 μm (hereinafter, referred to as Cerium Oxide Dispersion A) and 0.18 μm (hereinafter, referred to as Cerium Oxide Dispersion B).

Next, Water-Soluble Polymer A was added to deionized water to provide a concentration of 0.005% relative to the total amount of the polishing agent, Cerium Oxide Dispersion A was added to provide a cerium oxide particle concentration of 0.25% relative to the total amount of the polishing agent, and the pH was adjusted to 7.0 by further adding nitric acid to obtain Polishing Agent (1).

Examples 2 to 8, 10, and 12 to 14

Polishing Agents (2) to (8), (10), and (12) to (14) were obtained by adding the same Cerium Oxide Dispersion A and water-soluble polymer as in Example 1 to deionized water each to provide the concentration shown in Table 1 and after stirring, further adding a pH regulator to adjust the pH as shown in Table 1.

Example 15

Polishing Agent (15) was obtained by adding the same Cerium Oxide Dispersion A as in Example 1 to deionized water to provide the concentration shown in Table 1, followed by stirring, but not adding a water-soluble polymer.

Examples 16 to 18

Polishing Agents (16) to (18) were obtained by adding the same Cerium Oxide Dispersion A and water-soluble polymer as in Example 1 to deionized water each to provide the concentration shown in Table 1 and after stirring, further adding a pH regulator to adjust the pH as shown in Table 1.

The polishing properties (removal rate for silicon dioxide film, removal rate for silicon nitride film, and selection ratio) of each of Polishing Agents (1) to (18) obtained in Examples 1 to 18 were measured by the above-described methods. Incidentally, for the measurement of polishing properties, a blanket wafer was used as the polishing target (the object to be polished).

TABLE 1

| | Average Secondary Particle Diameter of Cerium Oxide Particle [μm] | Cerium Oxide Particle Concentration [mass %] | Kind of Water-Soluble Polymer | Water-Soluble Polymer Concentration [mass %] | pH regulator | pH | Removal Rate for Silicon Oxide Film [nm/min] | Removal Rate for Silicon Nitride Film [nm/min] | Selection Ratio |
|---|---|---|---|---|---|---|---|---|---|
| Example 1 | 0.11 | 0.25 | Water-Soluble Polymer A | 0.005 | nitric acid | 7.0 | 145 | 6.2 | 23 |
| Example 2 | 0.11 | 0.25 | Water-Soluble Polymer A | 0.01 | nitric acid | 7.0 | 121 | 4.0 | 30 |
| Example 3 | 0.11 | 0.25 | Water-Soluble Polymer A | 0.05 | nitric acid | 5.5 | 127 | 4.1 | 31 |
| Example 4 | 0.11 | 1.00 | Water-Soluble Polymer A | 1.20 | nitric acid | 6.3 | 265 | 5.4 | 49 |
| Example 5 | 0.11 | 0.25 | Water-Soluble Polymer A | 0.05 | nitric acid | 8.6 | 96 | 4.2 | 23 |
| Example 6 | 0.11 | 0.25 | Water-Soluble Polymer B | 0.10 | nitric acid | 4.3 | 66 | 1.1 | 60 |
| Example 7 | 0.11 | 0.25 | Water-Soluble Polymer B | 0.40 | nitric acid | 7.0 | 94 | 1.0 | 94 |
| Example 8 | 0.11 | 0.25 | Water-Soluble Polymer B | 0.10 | nitric acid | 8.0 | 127 | 2.4 | 53 |
| Example 9 | 0.18 | 0.50 | Water-Soluble Polymer A | 0.30 | nitric acid | 6.5 | 254 | 3.9 | 65 |
| Example 10 | 0.11 | 0.25 | Water-Soluble Polymer C | 0.06 | nitric acid | 6.4 | 152 | 3.1 | 49 |
| Example 11 | 0.18 | 0.25 | Water-Soluble Polymer D | 0.01 | nitric acid | 6.1 | 167 | 3.3 | 51 |
| Example 12 | 0.11 | 0.25 | Water-Soluble Polymer E | 0.05 | nitric acid | 7.0 | 84 | 3.1 | 27 |
| Example 13 | 0.11 | 0.25 | Water-Soluble Polymer A | 0.05 | nitric acid | 7.0 | 120 | 3.0 | 40 |
| Example 14 | 0.11 | 0.25 | Water-Soluble Polymer F | 0.20 | nitric acid | 8.0 | 230 | 3.2 | 72 |
| Example 15 | 0.11 | 0.25 | — | — | — | 7.0 | 329 | 27.0 | 12 |
| Example 16 | 0.11 | 0.25 | Water-Soluble Polymer G | 0.05 | nitric acid | 5.3 | 103 | 8.5 | 12 |
| Example 17 | 0.11 | 0.25 | Water-Soluble Polymer H | 0.02 | potassium hydroxide | 5.0 | 86 | 6 | 13 |
| Example 18 | 0.11 | 0.25 | Water-Soluble Polymer A | 0.05 | potassium hydroxide | 10.0 | 92 | 8 | 12 |

Examples 9 and 11

Polishing Agents (9) and (11) were obtained by adding Cerium Oxide Particle Dispersion B and the water-soluble polymer to deionized water each to provide the concentration shown in Table 1 and after stirring, further adding a pH regulator to adjust the pH as shown in Table 1.

[Storage Stability]

A polishing agent prepared by adding the water-soluble polymer shown in Table 2 below to deionized water to provide a concentration of 0.2% relative to the total amount of the polishing agent, adding Cerium Oxide Dispersion A to provide a cerium oxide particle concentration of 1.0% relative to the total amount of the polishing agent, and further adding nitric acid to adjust the pH to a predetermined value was stored at room temperature of around 25° C., and the change over time of the pH was checked, thereby effecting the test of storage stability. The results are shown in Table 2. As compared to the pH of the polishing agent on the day of the preparation, in the case where the pH thereof was not changed after 7 days, the storage stability of the polishing agent was evaluated as "A". On the other hand, in the case where the change in the pH of the polishing agent after 7 days was 0.5 or more, the storage stability of the polishing agent was evaluated as "B".

TABLE 2

| Average Secondary Particle Diameter [μm] | Cerium Oxide Particle Concentration [mass %] | Kind of Water-Soluble Polymer | Water-Soluble Polymer Concentration [mass %] | pH on the day | pH after 1 day | pH after 7 days | Storage Stability |
|---|---|---|---|---|---|---|---|
| 0.11 | 1 | Water-Soluble Polymer A | 0.2 | 4.1 | 4.1 | 4.1 | A |
| 0.11 | 1 | Water-Soluble Polymer E | 0.2 | 4.0 | 4.0 | 4.0 | A |
| 0.11 | 1 | Water-Soluble Polymer C | 0.2 | 4.0 | 5.8 | 5.2 | B |
| 0.11 | 1 | Water-Soluble Polymer D | 0.2 | 3.9 | 5.2 | 5.2 | B |

Tables 1 and 2 reveal the followings. Namely, it is seen that when polishing is performed using Polishing Agents (1) to (14) of Examples 1 to 14 each having a pH of 4 to 9 and including: a water-soluble polymer including a copolymer of a monomer (A) which includes at least one member selected from the group consisting of an unsaturated dicarboxylic acid, a derivative thereof, and salts of the unsaturated dicarboxylic acid and the derivative thereof and a monomer (B) other than the monomer (A), including an ethylenic double bond and no acidic group; a cerium oxide particle; and water, a high removal rate for a silicon dioxide film is obtained and the selection ratio of silicon dioxide film to silicon nitride film is high. In the case where the monomer (A) is an ester derivative, the selection ratio can be raised. In the case where the monomer (B) is a cyclic structure, the storage stability can be enhanced.

On the other hand, it is seen that Polishing Agent (15) not containing a water-soluble polymer which is a copolymer of the monomer (A) and the monomer (B) causes a decrease in the selection ratio of silicon dioxide film to silicon nitride film, compared with a case using Polishing Agents (1) to (14) of Examples 1 to 14 which are working examples.

In addition, it is seen that Polishing Agents (16) and (17) each using a water-soluble polymer which is close in terms of structure but is not a copolymer of the monomer (A) and the monomer (B) also cause a decrease in the selection ratio of silicon dioxide film to silicon nitride film, compared with a case using Polishing Agents (1) to (14) of Examples 1 to 14. Furthermore, it is seen that also when Polishing Agent (18) containing a water-soluble polymer which is a copolymer of the monomer (A) and the monomer (B) but having a pH of 10 or more is used, the selection ratio of silicon dioxide film to silicon nitride film decreases, compared with a case using Polishing Agents (1) to (14) of Examples 1 to 14.

The present application is based on Japanese patent application No. 2017-215520 filed on Nov. 8, 2017, and the contents of which are incorporated herein by reference.

According to the present invention, for example, in CMP of a surface to be polished including a surface including silicon oxide, a high selection ratio of silicon dioxide film to silicon nitride film can be achieved by keeping the removal rate for a silicon nitride film low while maintaining a sufficiently high removal rate for a silicon oxide film. The polishing agent and polishing method of the present invention are therefore suitable for flattening an insulating film for STI at the time of manufacture of a semiconductor device.

DESCRIPTION OF REFERENCE NUMERALS AND SIGNS

1: Silicon substrate, 2: silicon nitride film, 3: trench, 4: silicon dioxide film, 20: polishing apparatus, 21: semiconductor substrate, 22: polishing head, 23: polishing platen, 24: polishing pad, 25: polishing agent, and 26: polishing agent supply pipe.

What is claimed is:

1. A polishing agent comprising:
   a water-soluble polymer comprising a copolymer of a monomer (A) which comprises at least one member selected from the group consisting of an unsaturated dicarboxylic acid, a derivative thereof, and salts of the unsaturated dicarboxylic acid and the derivative thereof and a monomer (B) other than the monomer (A), comprising an ethylenic double bond and no acidic group;
   a cerium oxide particle;
   a pH regulator; and
   water,
   wherein:
   the polishing agent has a pH of 4 to 8.6; and
   at least a part of the unsaturated dicarboxylic acid is esterified.

2. The polishing agent according to claim 1, wherein the unsaturated dicarboxylic acid comprises at least one member selected from the group consisting of maleic acid, itaconic acid and fumaric acid.

3. The polishing agent according to claim 1, wherein the monomer (B) comprises a cyclic compound containing a 5-membered ring or a 6-membered ring.

4. The polishing agent according to claim 1, wherein the pH regulator is an acid.

5. The polishing agent according to claim 1, wherein, in the copolymer, a unit based on the monomer (A) has a salt of a carboxy group.

6. The polishing agent according to claim 1, wherein the monomer (B) comprises at least one member selected from the group consisting of styrene, N-vinylpyrrolidone and 4-vinylpyridine.

7. The polishing agent according to claim 6, wherein the unsaturated dicarboxylic acid comprises maleic acid, and the monomer (B) comprises styrene.

8. The polishing agent according to claim 6, wherein the monomer (A) comprises at least one member selected from the group consisting of an ester derivative in which at least a part of maleic acid is esterified, and a salt thereof.

9. The polishing agent according to claim 1, containing the water-soluble polymer in an amount of from 0.001 to 10.0 mass %.

10. The polishing agent according to claim 1, containing the water-soluble polymer in an amount of from 0.01 to 5.0 mass %.

11. The polishing agent according to claim 1, containing the cerium oxide particle in an amount of from 0.05 to 2.0 mass %.

12. A polishing method comprising bringing a polishing pad into contact with a surface to be polished, while supplying a polishing agent to perform polishing by relative movement thereof, wherein the surface to be polished including a surface comprising silicon oxide of a semiconductor substrate is polished with the polishing agent according to claim 1 as the polishing agent.

13. A liquid additive for polishing, which is a liquid additive for preparing a polishing agent by being added to a cerium oxide particle dispersion, the liquid additive comprising:
a water-soluble polymer comprising a copolymer of a monomer (A) which comprises at least one member selected from the group consisting of an unsaturated dicarboxylic acid, a derivative thereof, and salts of the unsaturated dicarboxylic acid and the derivative thereof and a monomer (B) other than the monomer (A), comprising an ethylenic double bond and no acidic group;
a pH regulator; and
water,
wherein:
the liquid additive has a pH of 4 to 8.6; and
at least a part of the unsaturated dicarboxylic acid is esterified.

* * * * *